(12) United States Patent
Liu

(10) Patent No.: US 8,502,239 B2
(45) Date of Patent: Aug. 6, 2013

(54) HIGH POWER ALLNGAN BASED MULTI-CHIP LIGHT EMITTING DIODE

(75) Inventor: Heng Liu, Sunnyvale, CA (US)

(73) Assignee: Bridgelux, Inc., Livermore, CA (US)

( * ) Notice: Subject to any disclaimer, the term of this patent is extended or adjusted under 35 U.S.C. 154(b) by 423 days.

(21) Appl. No.: 11/272,366

(22) Filed: Nov. 10, 2005

(65) Prior Publication Data

US 2006/0063288 A1 Mar. 23, 2006

Related U.S. Application Data

(62) Division of application No. PCT/US2004/014919, filed on May 11, 2004.

(51) Int. Cl.
*H01L 33/00* (2010.01)

(52) U.S. Cl.
USPC ............... 257/88; 257/98; 257/E33.068

(58) Field of Classification Search
USPC ............ 257/E33.006, E33.068, E33.072, 257/98, 88, E33.056–E33.059; 372/66
See application file for complete search history.

(56) References Cited

U.S. PATENT DOCUMENTS

| | | | |
|---|---|---|---|
| 3,974,514 A * | 8/1976 | Kressel et al. | ........ 257/E33.006 |
| 4,477,721 A | 10/1984 | Chappell et al. | |
| 4,501,061 A | 2/1985 | Wonnacott | |
| 4,675,058 A | 6/1987 | Plaster | |
| 4,707,716 A | 11/1987 | Daniele | |
| 4,963,933 A | 10/1990 | Brownlee | |
| 4,990,970 A | 2/1991 | Fuller | |
| 5,158,908 A | 10/1992 | Blonder et al. | |
| 5,252,839 A | 10/1993 | Fouquet | |
| 5,666,376 A * | 9/1997 | Cheng | .................. 257/E31.102 |
| 5,796,771 A | 8/1998 | DenBaars et al. | |
| 5,813,753 A * | 9/1998 | Vriens et al. | .................. 362/293 |
| 5,892,786 A | 4/1999 | Lott | |
| 5,895,228 A | 4/1999 | Biebuyck et al. | |
| 5,952,681 A * | 9/1999 | Chen | ............................ 257/98 |
| 6,030,849 A * | 2/2000 | Hasegawa et al. | ............. 438/46 |
| 6,140,243 A | 10/2000 | Wallace et al. | |
| 6,177,145 B1 | 1/2001 | Derderian et al. | |
| 6,307,218 B1 | 10/2001 | Steigerwald et al. | |
| 6,333,265 B1 | 12/2001 | Dixit et al. | |
| 6,333,522 B1 | 12/2001 | Inoue et al. | |
| 6,357,904 B1 | 3/2002 | Kawashima | |
| 6,392,979 B1 | 5/2002 | Yamamoto et al. | |

(Continued)

FOREIGN PATENT DOCUMENTS

| | | |
|---|---|---|
| EP | 1187228 | 3/2002 |
| EP | 1623450 A2 | 11/2004 |

(Continued)

OTHER PUBLICATIONS

EP1876645 A3 European Patent Application (Feb. 20, 2008).

(Continued)

*Primary Examiner* — Matthew Landau
*Assistant Examiner* — Sun M Kim
(74) *Attorney, Agent, or Firm* — Michael S. Garrabrants; ArtesynIP, Inc.

(57) ABSTRACT

A light emitting diode chip having a substantially transparent substrate and having an aspect ratio, which defines an elongated geometry provides enhanced efficiency and brightness. Method for forming and operating the same are also disclosed.

18 Claims, 4 Drawing Sheets

(56) References Cited

U.S. PATENT DOCUMENTS

| | | |
|---|---|---|
| 6,413,864 B1 | 7/2002 | Pyo |
| 6,429,462 B1* | 8/2002 | Shveykin .............. 257/E33.006 |
| 6,433,367 B1* | 8/2002 | Tohyama et al. ..... 257/E33.006 |
| 6,444,542 B2 | 9/2002 | Moise et al. |
| 6,455,340 B1 | 9/2002 | Chua et al. |
| 6,455,419 B1 | 9/2002 | Konecni et al. |
| 6,495,867 B1* | 12/2002 | Chen et al. ................... 257/190 |
| 6,531,390 B2 | 3/2003 | Chooi et al. |
| 6,537,838 B2* | 3/2003 | Stockman ...................... 438/22 |
| 6,562,416 B2 | 5/2003 | Ngo et al. |
| 6,570,190 B2 | 5/2003 | Krames et al. |
| 6,597,019 B2 | 7/2003 | Inoue et al. |
| 6,614,056 B1* | 9/2003 | Tarsa et al. ...................... 257/99 |
| 6,643,304 B1 | 11/2003 | Chen et al. |
| 6,646,292 B2 | 11/2003 | Steigerwald et al. |
| 6,649,440 B1 | 11/2003 | Krames et al. |
| 6,724,013 B2* | 4/2004 | Kneissl et al. .................. 257/79 |
| 6,784,462 B2 | 8/2004 | Schubert |
| 6,869,812 B1 | 3/2005 | Liu |
| 6,885,036 B2 | 4/2005 | Tarsa |
| 6,891,199 B2 | 5/2005 | Baur |
| 6,981,867 B2* | 1/2006 | Cao .................................. 433/29 |
| 6,987,789 B2 | 1/2006 | Bruesselbach et al. |
| 7,113,530 B2* | 9/2006 | Matsumoto et al. ....... 372/43.01 |
| 7,151,284 B2 | 12/2006 | Gwo |
| 2002/0020843 A1 | 2/2002 | Uemura |
| 2006/0255349 A1 | 11/2006 | Liu |

FOREIGN PATENT DOCUMENTS

| | | |
|---|---|---|
| EP | 2224466 A2 | 9/2010 |
| EP | 2224467 A2 | 9/2010 |
| JP | 56-079482 | 6/1981 |
| JP | 57-1275 | 1/1982 |
| JP | 62-19765 | 2/1987 |
| JP | 5-190897 | 7/1993 |
| JP | H10-107316 | 4/1998 |
| JP | 10-308532 | 11/1998 |
| JP | H10-308532 | 11/1998 |
| JP | 2001-101990 | 4/2001 |
| JP | 2001-127344 | 5/2001 |
| JP | 2001-176823 A | 6/2001 |
| JP | 2001-345480 | 12/2001 |
| JP | 2002-94118 | 3/2002 |
| JP | 2002-289015 | 10/2002 |
| JP | 2002-324912 | 11/2002 |
| JP | 2003-46137 | 2/2003 |
| KR | 2002-0068363 | 6/2001 |
| WO | 02/15287 | 2/2002 |
| WO | 2004/102632 A2 | 11/2004 |

OTHER PUBLICATIONS

Memorandum Opinion and Order Construing Claim Terms of United States Patent Nos. 6,869,812, 6,614,056 and 6,885,036, *Bridgelux, Inc.* v. *Cree, Inc.* Civil Action No. 9:06-CV-240 (Jun. 30, 2008) (EDTX).

Order on Agreed Claim Terms *Bridgelux, Inc.* v. *Cree, Inc.*, Civil Action No. 9:06-CV-240 (Jun. 30, 2008) (EDTX).

\* cited by examiner

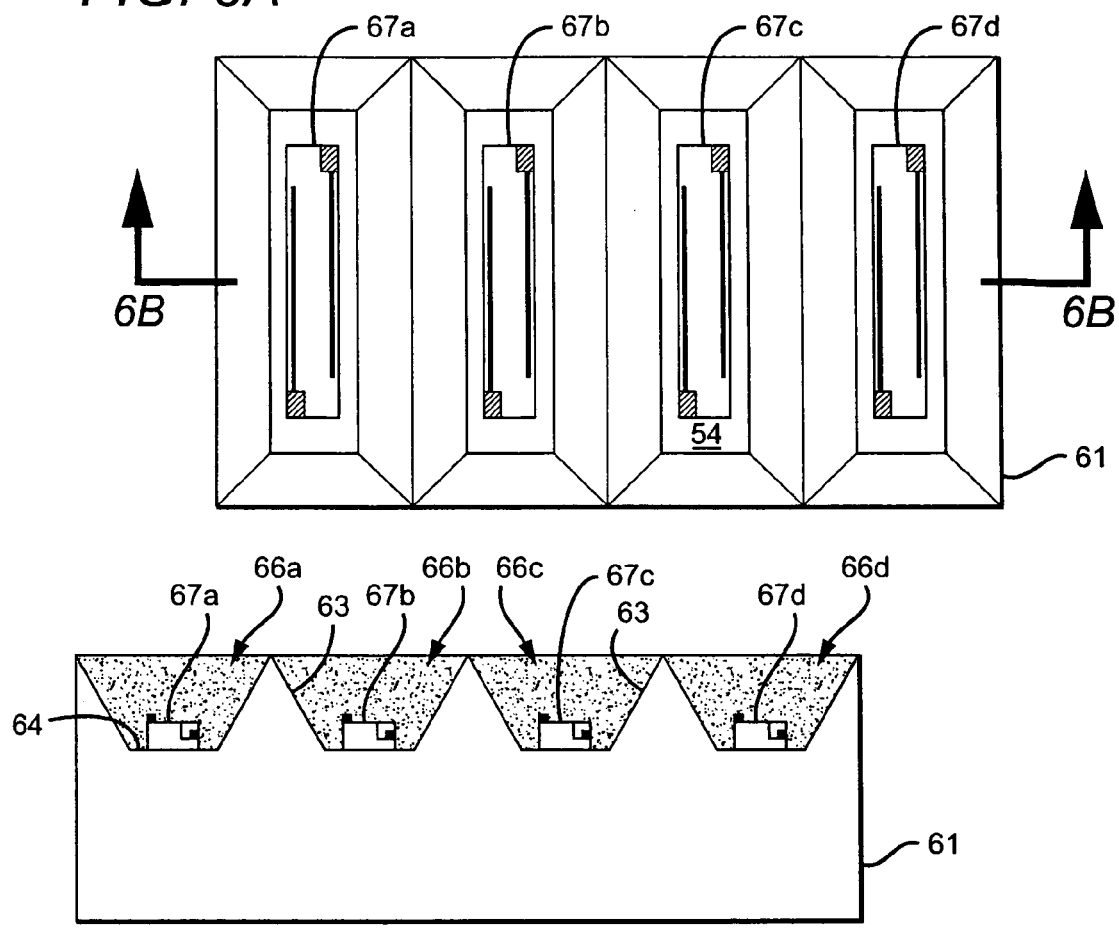
FIG. 6A
FIG. 6B
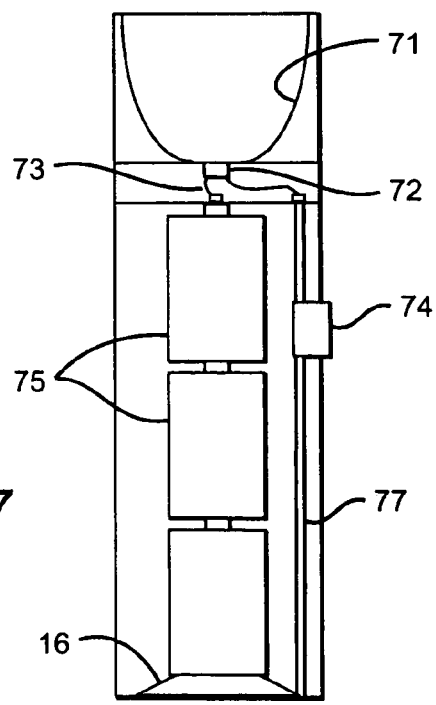
FIG. 7

HIGH POWER ALLNGAN BASED MULTI-CHIP LIGHT EMITTING DIODE

RELATED APPLICATIONS

This application is a Divisional Application of PCT Patent Application No. PCT/US04/14919, filed May 11, 2004, expired, which claims priority from U.S. patent application Ser. No. 10/438,108, filed on May 13, 2003, now U.S. Pat. No. 6,869,812, issued on Mar. 22, 2005. The contents of both these applications are incorporated by reference in their entireties herein.

FIELD OF THE INVENTION

The present invention relates generally to light emitting diodes (LEDs), as well as methods for producing and operating the same. More particularly, the present invention relates to an LED having an improved design which provides enhanced output characteristics. Even more particularly, the present invention relates to a high power AlInGaN LED assembly comprising multiple highly efficient, elongated chips assembled in an optimized reflective cup package.

BACKGROUND OF THE INVENTION

Light emitting diodes (LEDs) for use as indicators are well know. LEDs have been used extensively for this purpose in consumer electronics. For example, red LEDs are commonly used to indicate that power has been applied to such devices as radios, televisions, video recorders (VCRs) and the like.

Although such contemporary LEDs have proven generally suitable for their intended purposes, they possess inherent deficiencies which detract from their overall effectiveness and desirability. For example, the power output of such contemporary LEDs is not as great as is sometimes desired. This limits the ability of contemporary LEDs to function in some applications, such as providing general illumination, e.g., ambient lighting. Even high power contemporary LEDs do not provide sufficient illumination for such purposes.

Contemporary LEDs are also less efficient than desirable, thus making their use for general illumination less attractive. High power contemporary LEDs are even less efficient than standard LEDs, thus making high power LEDs even less attractive for some applications.

Attempts to overcome the limitation of contemporary LEDs associated with insufficient power output include the use of multiple LEDs which are ganged so as to provide the desired illumination. However, the use of multiple LEDs is more expensive than desired and inherently increases the size or volume of the illumination device, making it unsuitable for some applications.

AlInGaN based LEDs have attracted much attention in recent years due to their high potential for use as a solid state light source which is suitable for replacing traditional incandescent and fluorescent lighting. Although still not as efficient as desired, the efficiency of contemporary LEDs has been improved so much in the last decade that it is now higher than the efficiency of the common tungsten lamp.

LEDs produce light which is monochromatic. Thus, they are typically not suitable for general illumination, for which white light is generally desirable. However, by combining a blue AlInGaN LED with yellow phosphors, white light can be produced. This approach is now being used extensively in the manufacturing of white LEDs.

Nevertheless, white LEDs are more extensively used in backlight applications for liquid crystal displays (LCDs) than for general illumination. This is more due to the cost of making AlInGaN LEDs than to performance considerations. Ultimately one needs to optimize both cost and performance, so that LEDs can be competitive with respect to traditional light sources.

One issue relating to LEDs is that their efficiency can be adversely affected by heat generated within the device itself. This limits the amount of electrical power that can be used to drive an LED, and thus results in a limitation on maximum output optical power from an LED since the amount of light that can be generated is roughly proportional to the input electrical power.

The fundamental reason for lower efficiency caused by heat is due to temperature rises in the LED die. Higher operating temperatures not only degrade the light output efficiency, but also substantially reduce the life of the LED. Since heat generation in the LED is unavoidable, scientists have been trying to reduce the temperature rise by improving the heat removal rate. This can be accomplished by placing a heat sink close to the active region of the device and by choosing high thermal conductivity material for the heat sink.

Another approach is to use larger device size so that both the contact area to the outer thermal contact, as well as the total heat capacity, increases. For the same amount of heat generated, a larger device will remain cooler than a smaller device, thereby facilitating operation with higher input power. Of course, the higher the input power is, the higher the output optical power will be. Therefore, for a larger LED chip the total power that can be delivered from a single device increases and a cost saving is expected, since one large size device replaces several small size ones.

Referring now to FIG. 1, a simplified schematic of an AlInGaN on sapphire LED is shown. The most commonly used device size for an AlInGaN on sapphire LED is about 300×300 microns. The device is normally operated at 20-30 milliamps and 3.5 volts. Some contemporary designs may have different geometry, but the dimensions of the sides are approximately similar, i.e., the aspect ratio between the two sides of a contemporary LED is approximately 1. This is mainly due to the size of the conventional LED package, wherein a cup shaped recess is configured for an LED chip to mount therein and has a dimension of approximately 400 micron in either round or square.

Referring now to FIG. 2, a simplified schematic of a contemporary large size (high power) LED chip is shown. Recently, such large size AlInGaN based LED chips have become readily available. The dimension of these large size chips is about 1000×1000 microns. Usually, the actual device area (excluding the bond pads and etched recess) of a large chip is designed and optimized to operate under similar current density with respect to smaller contemporary LEDs, so that the heat generation rate per unit area is about the same in both instances. In general, the large size chip is operated at about 250-350 milliamps and 3.5 volts.

When designing a large size device, one needs to pay extra attention to how current will spread in the device, so that a minimum of current crowding occurs. Such current crowding occurs because the lateral resistance increases with the chip dimension and because current tends not to travel to far laterally before traveling vertically. When this happens, sufficient electrical contact distribution needs to be provided so as to ensure that substantially all of the lateral-current is evenly distributed. In actual practice, an inter-digital finger pattern is used, such as the one shown in FIG. 2.

Even though large size devices can deliver more output power per device, there is a light extraction problem associated with large dimension devices. When light is generated in an LED, some light escapes easily from the chip and some light doesn't, depending on the angle at which the light impinges upon the interface between the LED and the outside media. When the optical index of refraction of the media is smaller than the index of the LED material, light inside the LED will be reflected back to the LED when the angle of incidence is greater than a critical angle. The reflected light then bounces inside the LED until it finds a way out or is absorbed. The light intensity attenuates due to absorption in the bulk material.

The more light travels inside the LED and the larger the index of refraction of the LED material is, the less light will escape. Thus, it is desirable to minimize the number of bounces and the total travel distance before light can escape for any light transmissive layer of an LED.

Referring now to FIG. 3A, as the device size increases, light has a tendency to bounce more and thus travel a longer distance before exiting the device, resulting in increased light loss. FIG. 3B shows that light tends to bounce fewer times in a smaller device and thus travels a shorter distance. This is an especially serious issue for AlInGaN on sapphire LEDs, since both AlInGaN and sapphire have relatively higher indices of refraction when compared to other LED materials such as GaAs and AlInGaP (for infrared and red to amber colors). Because of the high index of refraction of AlInGaN and sapphire, a large portion of light actually travels in these two regions and escapes from the sides. Therefore, the lateral dimension of the device is an important consideration for AlInGaN LEDs.

One remedy to this problem involves mounting the chip upside down and providing a mirror coating on the epitaxial side, so as to redirect the light output thereof toward the substrate side. Since the index of refraction of sapphire (n=1.7) is lower than that of AlInGaN (n=2.5), sapphire provides a good index matching between the AlInGaN LED and the media (n=1.5 for most epoxy). The mirror coating on the epitaxial side reflects light toward the substrate. This design provides a better pathway for light to escape therefrom. In the actual practice, light efficiency is twice that of the non-flipped large size LED. However, the cost to make this device is high since not only a sub-mount is required between the chip and the final package, but also a precise alignment is needed to ensure proper electrical contact between the chip contact pads and the sub-mount. So far, there is no evidence that such fabrication can be a high yield process.

In the device shown in FIG. 2, there are two issues with respect to light extraction. Besides the light which escapes from the device without bounces, the remaining light basically travels in the epitaxial layer region and the substrate region before finding an exit. Most of the light exits from the sides of the device. For light traveling in the substrate region, it suffers the same problems as discussed above with reference to FIG. 3A. That is, the light attenuates due to bulk and interface absorptions. This is true for both directions, i.e., parallel and perpendicular to the fingers.

For light traveling in the epitaxial layers, the light loss due to the large dimension is only along the parallel direction to the fingers. Since the distance light travels perpendicular to the fingers is much shorter before impinging upon the two sides, light escapes relatively easily with much less loss as compared to the other, longer, direction.

However, light which exits from one of the sides could hit the metal finger and then be absorbed thereby. Unfortunately, the most commonly used metals, such as Au or an Au based alloy, readily absorb light in the blue spectrum.

In actual practice, as depicted in FIG. 1 and FIG. 2, the light extraction efficiency of the 1000×1000 micron device is only ⅓ of that of the 300×300 micron device, due to the issues discussed in detail above. Because of this, even though the device area of the 1000×1000 micron chip is more than 10 times of the 300×300 micron chip, the output power is only about 3-4 times.

As such, although the prior art has recognized, to a limited extent, the problems of insufficient illumination and poor efficiency, the proposed solutions have, to date, been ineffective in providing a satisfactory remedy. Therefore, it is desirable to provide an LED having increased optical output power and enhanced efficiency. More particularly, it is desirable to provide an LED having a larger active surface, so as to provide increased brightness and efficiency with respect to contemporary LEDs.

BRIEF SUMMARY OF THE INVENTION

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112.

The present invention specifically addresses and alleviates the above mentioned deficiencies associated with the prior art. More particularly, the present invention comprises a light emitting diode chip having a substantially transparent substrate and having an aspect ratio which defines an elongated geometry, so as to provide enhanced efficiency and brightness, and a method for forming the same.

These, as well as other advantages of the present invention, will be more apparent from the following description and drawings. It is understood that changes in the specific structure shown and described may be made within the scope of the claims, without departing from the spirit of the invention.

The invention can be better visualized by turning now to the following drawings wherein like elements are referenced by like numerals.

BRIEF DESCRIPTION OF THE DRAWINGS

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

FIG. 6A is a plan view showing another exemplary arrangement of four 250×1000 micron LEDs disposed within a recessed package having a reflective coating formed upon the inside surface of the package;

FIG. 6B is a cross-sectional side view of the exemplary arrangement of four 250×1000 micron LEDs disposed within a recessed package of FIG. 6A, taken along line 6B thereof;

FIG. 7 is a semi-schematic cross-sectional view of a flashlight formed according to the present invention;

DETAILED DESCRIPTION OF THE PREFERRED EMBODIMENTS

Figure 1:
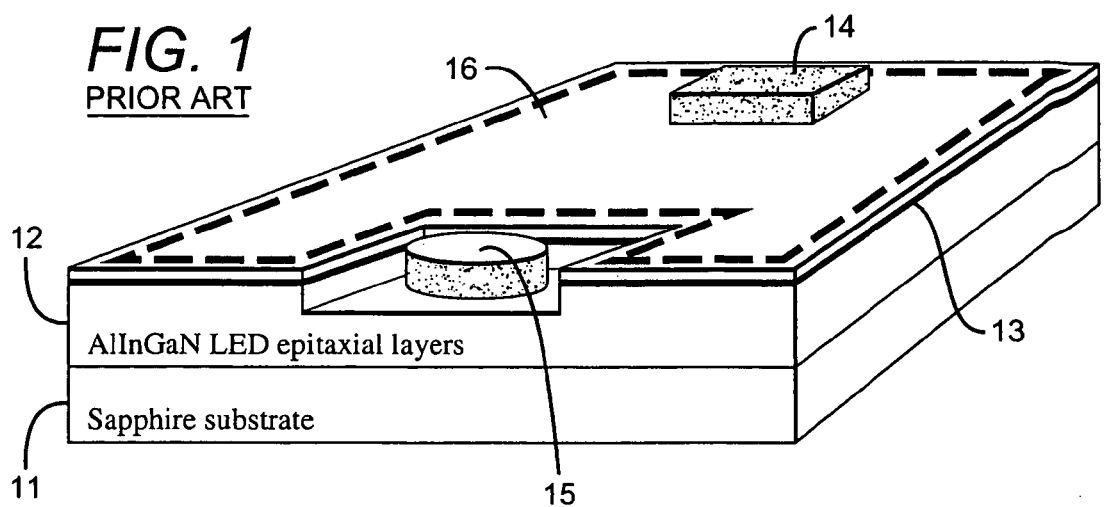
FIG. 1 is a semi-schematic representation of a typical contemporary standard (300×300 micron) AlInGaN LED formed upon a transparent sapphire substrate.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

Thus, the detailed description set forth below in connection with the appended drawings is intended as a description of the presently preferred embodiments of the invention and is not intended to represent the only forms in which the present invention may be constructed or utilized. The description sets forth the functions and the sequence of steps for constructing and operating the invention in connection with the illustrated embodiments. It is to be understood, however, that the same or equivalent functions may be accomplished by different embodiments that are also intended to be encompassed within the spirit of the invention.

According to one aspect, the present invention comprises a method for fabricating a light emitting diode (LED) chip, the method comprises forming a substantially transparent substrate having an aspect ratio which defines an elongated geometry. More particularly, the present invention comprises a method for forming a high power light emitting diode chip, wherein the method comprising providing a substantially transparent substrate, forming at least one active region upon the substrate, and cutting, e.g., dicing, the substrate to form at least one light emitting diode chip having an active area with an aspect ratio which is greater than approximately 1.5 to 1.

Preferably, the aspect ratio of the active area is greater than approximately 2 to 1. Preferably, the aspect ratio of the active area is between approximately 1.5 to 1 and approximately 10 to 1. Preferably, the aspect ratio of the active area is approximately 4 to 1. Preferably, the width thereof is approximately 250 microns and the length thereof is approximately 1000 microns.

However, those skilled in the art will appreciate that various equivalent elongate structures of the active area likewise suitable. For example, the active area may alternatively be defined by a plurality of elongate structures which are integrally formed with respect to one another so as to define a more complex configuration. One example of such a complex configuration formed from elongate structures is a cross. Another example is a plurality of spokes radiating from a common central point, much like the spokes of a wagon wheel, thus generally providing the appearance of an asterisk.

Preferably, the active region is configured to operate at between approximately 3.0 volts and approximately 3.5 volts and between approximately 60 milliamps and approximately 90 milliamps. However, those skilled in the art will appreciate that various other operating parameters are likewise suitable, particularly when the active area is defined by materials other than AlInGaN.

The active regions are optionally in electrical communication with one another so as to define a network such that voltage within the network tends to be maximized without current through any light emitting diode chip being greater than a predetermined value. By maximizing voltage within the network, the efficiency of power transmission therein is desirably enhanced.

Preferably, one light emitting diode device is formed upon each substrate and the active area substantially covers substantially the entire surface of each substrate. However, a plurality of elongated active areas may alternatively be formed upon a common substrate. In this instance, the active areas will not completely cover the substrate.

For example, an array of elongated active areas may be etched onto a single substrate. As a further example, a cross or radiating spoke patterned active area may be formed upon a substrate. In these two examples, the active area will not cover substantially the entire surface of the substrate. For instance, it will not cover the area between the radiating spokes.

Preferably, the substrate comprises a material selected from the group comprising sapphire, spinel, glass, ZnO, SiC, MgO, GaN, AlN, and AlGaN. Preferably, the active region comprises AlInGaN. However, as those skilled in the art will appreciate, other materials for the substrate and/or the active area are likewise suitable.

According to one aspect, the method of the present invention comprises forming an upper LED layer and a lower LED layer (with opposite type with respect to the upper LED layer) which cooperate to define the active region; forming an upper contact finger upon the upper LED layer; forming a lower contact finger upon the lower LED layer; and forming a reflector intermediate the active region and the lower contact finger, the reflector being configured to reflect light directed from the active region toward the lower contact finger away from the lower contact finger so as to enhance a brightness of the light emitting diode chip. Preferably, the reflector is formed upon the active region intermediate the active region and the lower contact finger.

The reflector may comprise either a dielectric reflector or a metal reflector. If the reflector comprises a metal reflector, then a transparent insulator is preferably formed upon the active region intermediate the active region and the lower contact finger to electrically insulate the reflector from the active region.

According to one aspect, the present invention comprises a light emitting diode chip comprising a substantially transparent substrate and having an aspect ratio which defines an elongated geometry. More particularly, the present invention comprises a high power light emitting diode chip comprising a substantially transparent substrate, an active region formed upon the substrate, and wherein an aspect ratio of the active area is greater than approximately 1.5 to 1.

According to one aspect, the present invention comprises high power light emitting diode chip comprising a reflector disposed intermediate the active region and the lower contact finger, the reflector being configured to reflect light directed from the active region toward the lower contact finger away from the lower contact finger so as to enhance a brightness of the light emitting diode chip.

According to one aspect, the present invention comprises a high power light emitting diode lamp comprising a package and at least one light emitting diode chip disposed within the package.

The package preferably comprises four reflective sides and a reflective bottom. The package preferably defines a rectangle. The package preferably defines a square. However, as those skilled in the art will appreciate, the package may alternative define any other desired shape. For example, the package may alternative be round.

The high power light emitting diode lamp preferably comprises a plurality of light emitting diode chips. The light emitting diode chips may be electrically in series with one another, electrically in parallel with one another, or electrically in some combination of series and parallel with one another. For example, in a high power light emitting diode lamp having four light emitting diodes, pairs of the light emitting diodes may individually be in parallel with one another and the two pairs then (each as a grouped pair) be in series with one another.

Preferably, the package is configured such that a manufacturer who is incorporating the high power light emitting diode lamps of the present invention into an illuminator product can easily select the desired electrical configuration (series, parallel, or a combination of series and parallel) of the light emitting diodes. For example, such selection may be performed by bonding conductors to selected pads of the high power light emitting diode lamp, by selecting the position of switches, by adding or moving jumpers, by burning or removing jumpers, or by any other desired method.

The high power light emitting diode lamp preferably comprises four light emitting diode chips. The four light emitting diode chips are preferably configured to generally define a square.

Optionally, the light emitting diode chips may be configured to generally define a linear array thereof. Alternatively, the light emitting diodes may be disposed end-to-end so as to define the outline of a square.

The package preferably comprises at least one recess with a reflective coating therein, the light emitting diode(s) being disposed within the recess. The package optionally comprises a plurality of recesses, each recess having a reflective coating therein, at least one light emitting diode being disposed within each recess. For example, the package may comprise a recessed package having four recesses, each recess having a reflective coating therein, one light emitting diode being disposed within each of the four recesses.

According to one aspect of the present invention, the package comprises a recessed package having four elongated recesses, each elongated recess having a reflective coating formed therein, and one light emitting diode is disposed within each elongated recess.

According to one aspect of the present invention, an illumination device comprise a power source and at least one high power light emitting diode lamp in electrical communication with the power source. The power source may comprise, for example, at least one battery, a plug configured to be connected to a wall socket, or an AC power source and a DC power supply coupled to convert AC current from the AC power source into DC power suitable for operating the light emitting diodes.

Thus, the present invention provides an LED chip design which alleviates problems (such as poor efficiency and inadequate brightness) associated with contemporary LED chips. The chip has a high aspect ratio between the two adjacent sides thereof, so that light can easily escape from the long dimension side, thus substantially enhancing the brightness of the device. The elongated configuration of the LED chip also enhances heat dissipation, thus allowing the device to be operated at higher current levels to facility further enhancement of the light output thereof, as well as for improvement of the efficiency thereof.

The present invention is illustrated in FIGS. 1-6B, which depict presently preferred embodiments thereof.

Referring now to FIG. 1, a contemporary standard 300× 300 micron AlInGaN LED formed upon a transparent sapphire substrate is shown. This contemporary device comprises a transparent sapphire substrate 11, AlInGaN epitaxial layers 12 formed upon the substrate 11, a active region 13 defined by the AlInGaN epitaxial layers 12, an upper or P bond pad 14 formed upon upper ones epitaxial layers 12, a lower or N bond pad 15 formed upon lower ones of the epitaxial layers 12 and a P current spreading layer 16.

Figure 2:
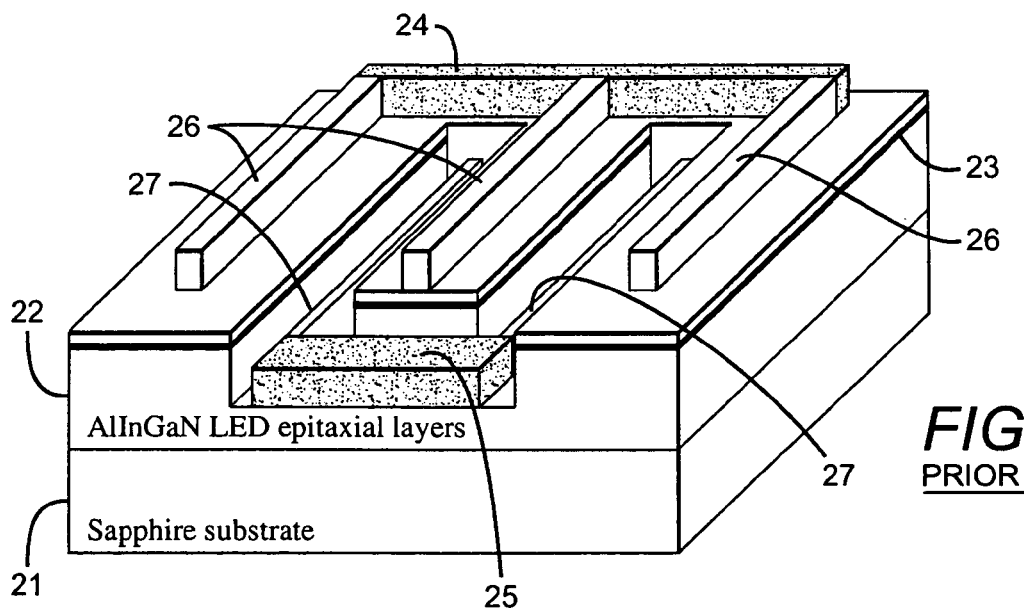
FIG. 2 is a semi-schematic representation of a contemporary high power (1,000×1,000 micron) AlInGaN LED, showing the interdigital contact fingers thereof.

Referring now to FIG. 2, a contemporary high power 1000×1000 micron AlInGaN LED formed upon a transparent sapphire substrate is shown. This high power LED is an attempt to provide a brighter LED than the standard LED shown in FIG. 1. Because of its larger size, interdigit contact fingers 26, 27 are used to spread current through the active layer. This larger contemporary device comprises a transparent sapphire substrate 21, AlInGaN epitaxial layers 22 formed upon the substrate 21, a active region 23 defined by the AlInGaN epitaxial layers 22, an upper or P finger interconnect 24 formed upon upper ones of the epitaxial layers 22 and a lower or N finger interconnect 25 formed upon lower ones of the epitaxial layers 22. Upper or P contact fingers 26 spread from the P finger interconnect 24 and lower or N contact fingers 27 similarly spread from the N finger interconnect 25.

Referring now to FIGS. 1 and 2, when the size of contemporary chips size increases from 300×300 microns (FIG. 1) to 1000×1000 microns (FIG. 2), the optical output efficiency decreases by about 60%-70%. Thus, although the high power LED does provide increased brightness, it does so by sacrificing efficiency.

Figure 3A:
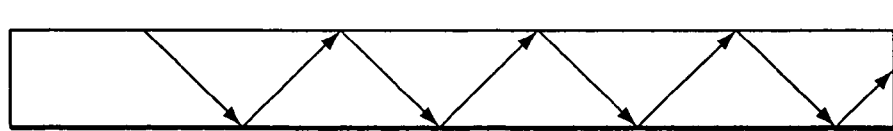
FIG. 3A is a side view showing light propagating along a long path within a higher index of refraction material (such as a sapphire substrate or an epitaxial LED layer) until it finally escapes into a lower index of refraction material (such as air)
Figure 3B:
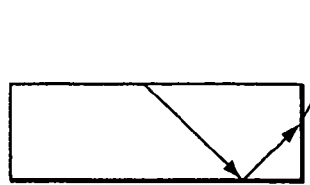
FIG. 3B is a side view showing light propagating along a short path within a higher index of refraction material (such as a sapphire substrate or an epitaxial LED layer) until it finally escapes into a lower index of refraction material (such as air)

Referring now to FIGS. 3A and 3B, this reduction in optical output efficiency as the size of the chip increases is due to the increase path length that light must travel, on average, before exiting the device. Light traveling in any layer of the LED, such as the active layer or the substrate, must typically be reflected several times prior to exiting the device. Of course, the larger the LED is, the longer the path is and the more opportunities that exist for absorption of the light both within the layer and at the interface between adjacent layers. Thus, light traveling along a longer path (such as through a larger chip), as shown is FIG. 3A, will be attenuated more, on average, than light traveling along a shorter path (such as through a smaller chip), as shown in FIG. 3B.

Figure 4:
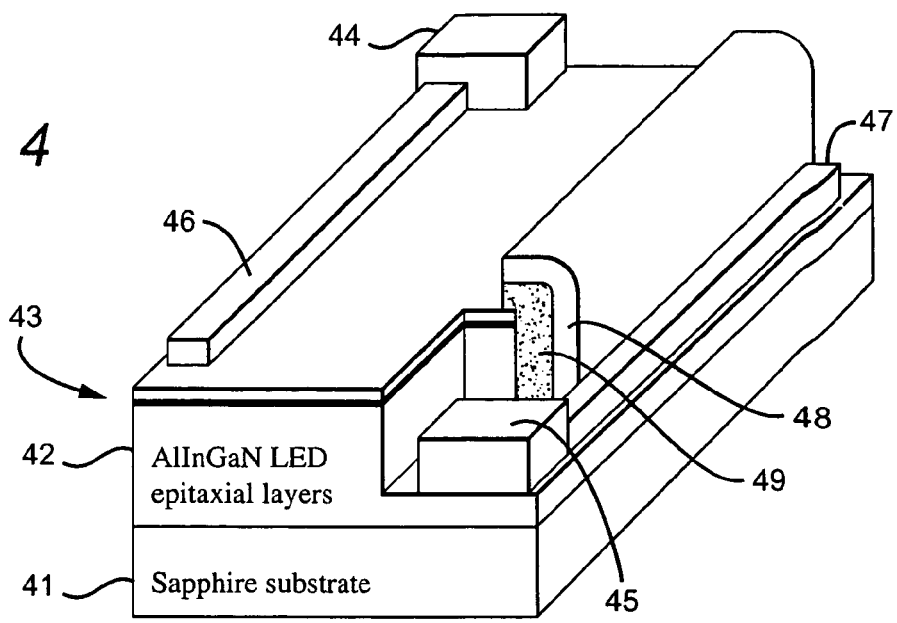
FIG. 4 is a is a perspective view of an elongated power LED having a high aspect ratio and having a reflective coating formed upon one sidewall thereof according to the present invention.

Referring now to FIG. 4, an LED having an elongated geometry according to the present invention is shown. The present invention comprises a transparent sapphire substrate 41, AlInGaN epitaxial layers 42 formed upon the substrate 41, a active region 43 defined by the AlInGaN epitaxial layers 42, an upper or P bond pad 44 formed upon upper ones of the epitaxial layers 42, a lower or N bond pad 15 formed upon lower ones of the epitaxial layers 42, a P contact finger 46 extending from the P bond pad 44, and a N contact finger 47 extending from the N bond pad 45.

Optionally, a reflective coating 48 is formed upon the epitaxial layers 42 (and is thus formed upon the active region 43). Alternatively, the reflective coating may be formed upon the N contact finger 47 or may otherwise be formed intermediate the epitaxial layers 42 and the N contact finger 47. The reflector is configured so as to reflect light from the epitaxial layers 43 back into the epitaxial layers 43 and thus away from the N contact finger 47. In this manner, the reflected light may exit the epitaxial layers 43 at some other location (rather than proximate the N contact finger 47) and thus contribute to the brightness of the LED (rather than be absorbed by the N contact finger 47).

The reflector 48 may be either a dielectric reflector or a metal reflector. If a metal reflector is utilized, then an insulator 49 is formed upon the epitaxial layers 42 intermediate the reflector 48 and the epitaxial layers 42 to prevent undesirable current flow through the reflector 48.

According to the present invention the loss of light can be reduced appreciably by decreasing the size of the chip, and thus the size of the active area and the size of the substrate, in one dimension (thus defining an elongated geometry). By providing a reflective coating or reflector on one side of the mesa to avoid undesirable absorption of light by the N contact finger 47, a further reduction of light loss can be provided.

Since total area of the device is now also reduced with respect to contemporary high power LEDs, multiple LEDs can be used to increase the power capacity. A 250×1000 micron device is shown in FIG. 4 as one exemplary embodiment of the present invention. Those skilled in the art will appreciate that other dimensions and configurations of the present invention are likewise suitable.

To maintain the same current density during operation of the present invention as in contemporary devices, the present invention is preferably configured to operate at 3.0-3.5 volts and 60-90 milliamps (since the active area of the present invention is approximately 25% of the active area of a contemporary 1000×1000 micron device). In order to produce as much optical output power as the contemporary 1000×1000 micron device, a set of four 250×1000 micron devices can be assembled in one package.

Referring now to FIGS. 5A-6B, two packaging configurations of the present invention are shown. In many-applications, a point light source is preferred since it generates a spherical light pattern which is useful to construct any shape of plane by arranging the point sources in arrays. In order to provide such a point source, several elongated chips can optionally be arranged in a single package so as to produce a spherical light pattern.

Figure 5A:
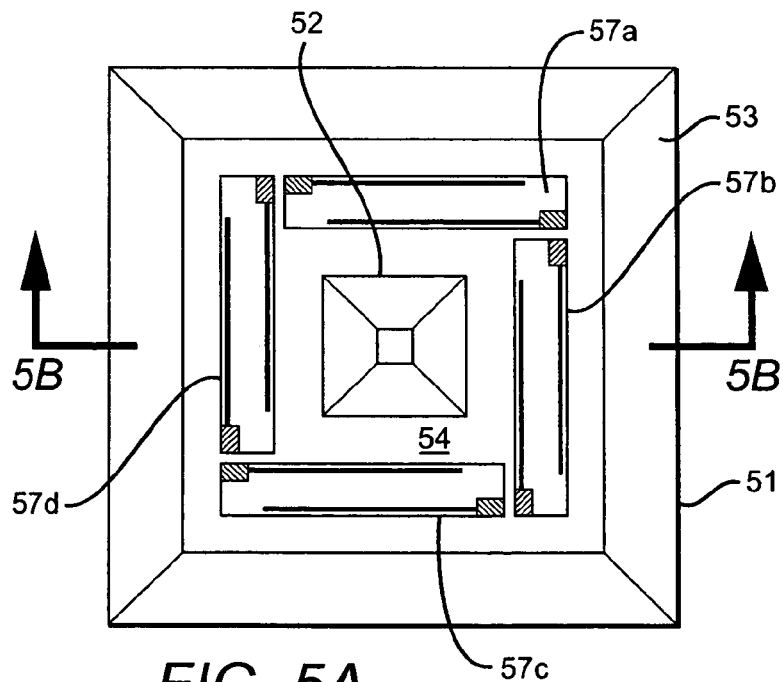
FIG. 5A is a plan view showing one exemplary arrangement of four 250×1000 micron LEDs disposed within a recessed package having a reflective coating formed upon the inside surface of the package.

Both of the packaging examples of FIGS. 5A and 6A use four 250×1000 micron chips. Each chip is arranged in a reflective cup designed to direct the side light upward individually.

Figure 5B:
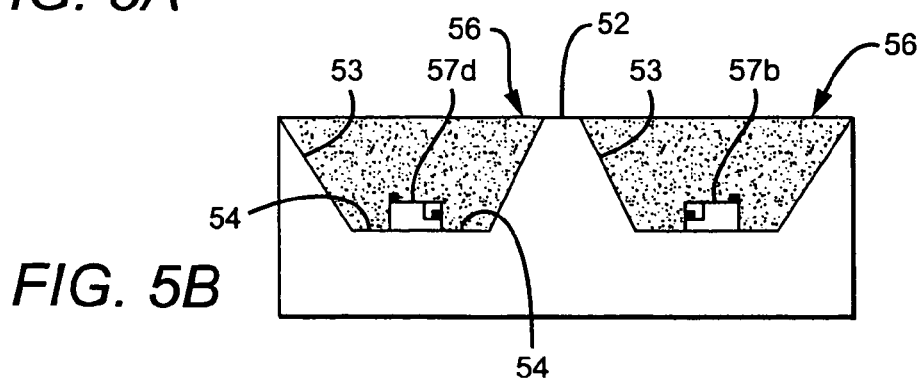
FIG. 5B is a cross-sectional side view of the exemplary arrangement of four 250×1000 micron LEDs disposed within a recessed package of FIG. 5A, taken along line 5B thereof.

The package shown in FIGS. 5A and 5B is a single recess cup 51 having an upwardly extending centerpiece 52 in the fashion of a tube pan or bundt pan. The recess 56 is suitable for receiving a plurality, e.g., four, individual LED chips 57a-57d. The interior sides 53 and bottom 54 of the package, including the centerpiece 52 are reflective, so as to enhance the amount of light provided by the LED.

The package show in FIGS. 6A and 6B is a multiple recess cup 61 having a plurality of separate recesses formed therein. Each recess is configured to receive a separate LED chip 67a-67d. The interior of each recess. 66a-66d, including the sides 63 and the bottoms 64, is reflective.

The individual reflective recess 66a-66d for each chip 67a-67d is advantageous, since without it the side light from the chips could re-enter the near by chips from its side.

Referring now to FIG. 7, a semi-schematic cross-sectional view of a flashlight shows a high power LED package 72 formed according to the present invention which is disposed behind a focusing optical coating or reflector 71. An electrical connection 73 to batteries 75, in cooperation with spring electrical contact 76, conductor 77, and switch 74, facilitate operation of the flashlight according to contemporary practice. According to this exemplary embodiment of the flashlight, the LEDs are powered by three batteries at 4.5 volts. However, those skilled in the art will appreciate that various other configurations of the flashlight are likewise suitable. Indeed, the present invention may find application in various different portable (battery operated) lighting applications.

An added advantage of the arrangements shown in FIGS. 5A-6B is that the operating voltage and current of the total package can be changed easily by bonding the chips in series, parallel or a combination of both, as discussed above. For example, if all 4 devices are connected in series, then the operating parameters will be 12-14 volts and 60-90 milliamps. If they are connected in parallel, then the operating condition will become 3-3.5 volts and 240-360 milliamps. If 2 devices are in parallel and 2 devices are in series, the operating parameters will be 6-7 volts and 120-180 milliamps. This flexibility is useful for circuit designer since there are different requirement in power system applications. Usually to mitigate electrical power loss in the power distribution network or local power supply, high voltage and low current is more desirable than low voltage and high current. Examples of different electrical connections of the LEDs are provided in FIGS. 8A, 8B and 8C, discussed below.

Figure 8A:
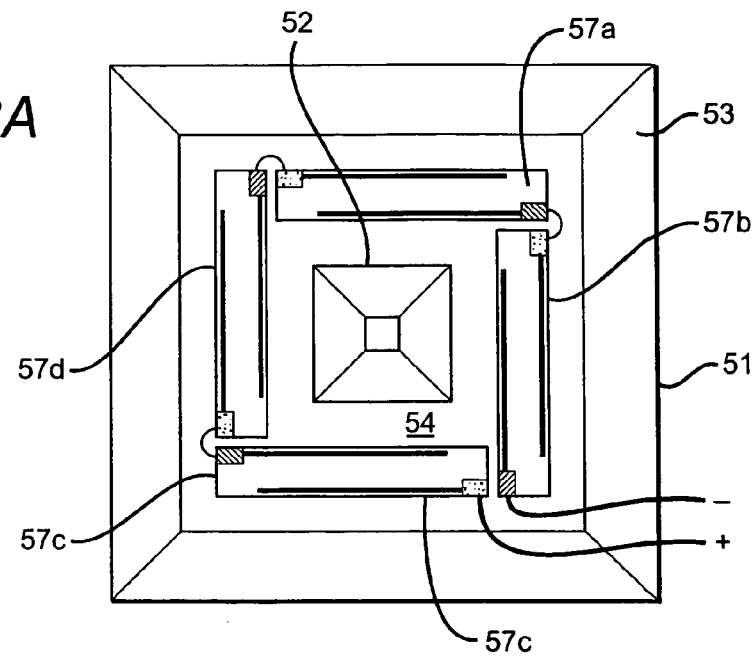
FIG. 8A is the exemplary arrangement of four LEDs disposed within a recessed package of FIG. 5A, showing the LEDs electrically connected to one another in series.

Referring now to FIG. 8A, the LEDs of FIG. 5A are electrically connected to one another in series. This configuration of the LEDs operates at high voltage and low current. For example, LEDs of the present invention operated in this configuration may operate at 14 volts and 90 milliamps.

Figure 8B:
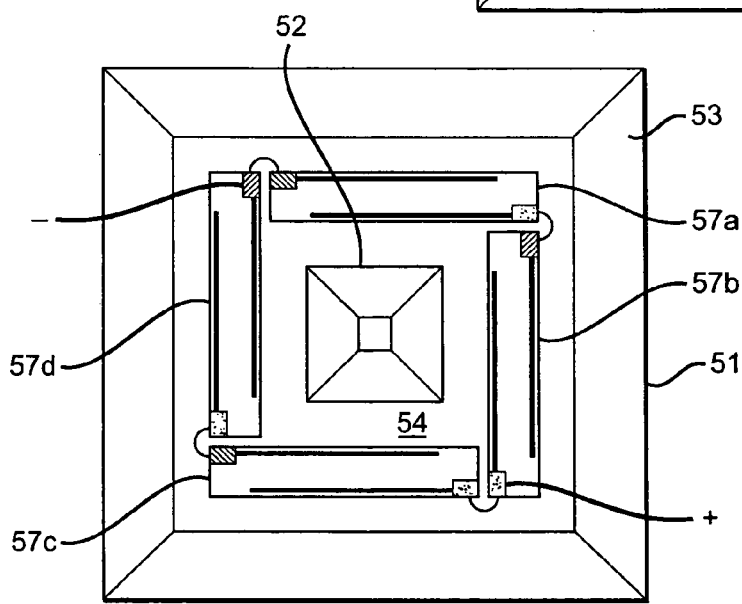
FIG. 8B is the exemplary arrangement of four LEDs disposed within a recessed package of FIG. 5A, showing two pairs of the LEDs electrically connected to one another in parallel.

Referring now to FIG. 8B, two pairs the LEDs of FIG. 5A are electrically connected to one another in parallel to provide a 2×2 configuration. For example, LEDs of the present invention operated in this configuration may operate at 7 volts and 180 milliamps.

Figure 8C:
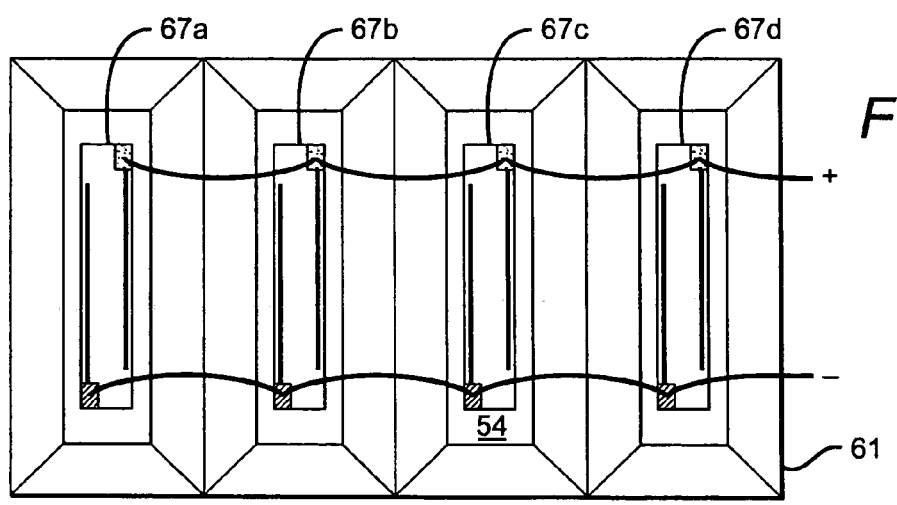
FIG. 8C is the exemplary arrangement of four LEDs disposed within a recessed package of FIG. 6A, showing all four of the LEDs electrically connected to one another in parallel.

Referring now to FIG. 8C, the LEDs of FIG. 5A are all electrically connected to one another in parallel. For example, LEDs of the present invention operated in this configuration may operate at 3.5 volts and 360 milliamps.

The advantages of the present invention include superior light output efficiency due to both the elongated geometry thereof and the reflective coating on the side of the elongated chip. The present invention provides a power LED device assembly and package that generates an approximately spherical light pattern with superior light output efficiency as compared to contemporary LEDs. Further, the present invention provides flexibility in operating voltage and current in the packaged power LED to facilitate a circuit designer's ability to optimize his design to the requirement of the applications.

It is understood that the various aspects of the exemplary high power AlInGaN based multi-chip light emitting diode described herein and shown in the drawings represent only presently preferred embodiments of the invention. Indeed, various modifications and additions may be made to such embodiments without departing from the spirit and scope of the invention. For example, the various different shapes and configuration of the active area, either upon a common or upon separate substrates, are contemplated. Those skilled in the art will appreciate that equivalent structures, shapes and configurations may be formed by providing a wide variety of elongated structures and/or portion of structures. Thus, it is not necessary that the entire active area define an elongated geometry, but rather that some portion or portions of the active are define one or more elongated geometries.

Thus, these and other modifications and additions may be obvious to those skilled in the art and may be implemented to adapt the present invention for use in a variety of different applications.

The invention claimed is:

1. A lamp, comprising:
    a plurality of light emitting diode chips, each comprising
        a substrate;
        a lower epitaxial layer formed upon the substrate;
        an upper epitaxial layer, formed upon the lower epitaxial layer to expose a portion of the lower epitaxial layer;
        an upper contact finger formed upon the upper epitaxial layer;
        a lower contact finger formed upon the exposed portion of the lower epitaxial layer, generally parallel to a length of the lower epitaxial layer, wherein the upper and lower epitaxial layers cooperate to form a generally planar active area, a ratio of a length of the active area to a width of the active area is at least 1.5:1, and the width of the active area is at least 250 microns; and
        a reflective material intermediate the lower contact finger and the upper epitaxial layer to direct light away from the lower contact finger; and
    a package having a recess defined by a bottom surface and four sidewalls in which pairs of sidewalls are generally co-parallel and intersect to define four corners of the recess, the plurality of diode chips disposed in the recess, and are arranged around the periphery of the recess, with lengths of the diode chips co-parallel to the sidewalls, and each end of each of the diode chips disposed around the periphery of the recess either abut one of the corners of the recess, or abut an edge of another diode chip arranged around the periphery of the recess, and one or more of the plurality of light emitting diode chips are indirectly coupled to receive a biasing voltage from a pair of bonding wires respectively connected to different light emitting diode chips of the plurality.

2. The lamp of claim 1, wherein the reflective material comprises a reflecting insulator material.

3. The lamp of claim 1, wherein the reflective material comprises an insulator material, and a metallic material electrically shielded from the upper epitaxial layer by the insulator material.

4. The lamp of claim 1, wherein the upper epitaxial layer and the lower epitaxial layer have an elongated geometry.

5. The lamp of claim 4, wherein the lower contact finger is disposed generally parallel to a longer side of the lower epitaxial region.

6. The lamp of claim 4, wherein the elongated geometry provides an active region having a length to width ratio of at least 2:1.

7. The lamp of claim 4, wherein the elongated geometry provides an active region having a length to width ratio of at least 2:1 and less than 10:1.

8. The lamp of claim 1, wherein the reflective material comprises a transparent insulator material and a metallic reflecting material electrically shielded from the upper epitaxial layer by the insulator material.

9. The lamp of claim 1, wherein the lower epitaxial layer comprises an n-doped layer.

10. The lamp of claim 1, wherein the upper epitaxial layer comprises a p-doped layer.

11. The lamp of claim 1, wherein the upper contact finger comprises a bond pad portion.

12. The lamp of claim 1, further comprising a bond pad in electrical contact with the upper contact finger.

13. The lamp of claim 1, wherein the lower contact finger comprises a bond pad portion.

14. The lamp of claim 1, further comprising a bond pad in electrical contact with the lower contact finger.

15. The lamp of claim 1, wherein one light emitting diode is formed upon the substrate.

16. The lamp of claim 1, wherein the substrate comprises a material selected from the group consisting of:
    sapphire;
    spinel;
    glass;
    ZnO;
    SiC;
    MgO;
    GaN;
    MN; and
    AlGaN.

17. The lamp of claim 1, wherein an active region is formed so as to cover substantially all of the substrate that is not covered by the lower epitaxial layer, the reflective material, or the lower contact finger.

18. The lamp of claim 1, wherein the package further comprises a reflective protrusion disposed centrally in the recess and configured for reflecting light from the package.

* * * * *